United States Patent
Chung

(10) Patent No.: US 8,052,790 B2
(45) Date of Patent: Nov. 8, 2011

(54) MASK FOR SILICON CRYSTALLIZATION, METHOD OF FORMING POLY-SILICON THIN FILM, AND MANUFACTURING METHOD OF THIN FILM TRANSISTOR

(75) Inventor: Se-Jin Chung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/407,405

(22) Filed: Mar. 19, 2009

(65) Prior Publication Data

US 2009/0258465 A1 Oct. 15, 2009

(30) Foreign Application Priority Data

Apr. 10, 2008 (KR) ........................ 10-2008-0033175

(51) Int. Cl.
*C30B 29/06* (2006.01)

(52) U.S. Cl. .................................. 117/4; 117/8; 438/30
(58) Field of Classification Search .................. 117/4, 8; 438/30
See application file for complete search history.

(56) References Cited

U.S. PATENT DOCUMENTS

| 7,384,476 B2* | 6/2008 | You ................................... 117/8 |
| 2005/0142680 A1* | 6/2005 | Ha et al. ........................ 438/30 |

* cited by examiner

*Primary Examiner* — Bob M Kunemund
(74) *Attorney, Agent, or Firm* — Cantor Colburn LLP

(57) ABSTRACT

A silicon crystallization mask of the present invention includes; a main exposure portion including a plurality of complete light transmission regions which completely transmit light therethrough, and a preliminary exposure portion including a plurality of incomplete light transmission regions, which each partially transmit light therethrough, wherein at least two of the incomplete light transmission regions have different magnitudes of light transmittance from each other.

16 Claims, 7 Drawing Sheets

MASK FOR SILICON CRYSTALLIZATION, METHOD OF FORMING POLY-SILICON THIN FILM, AND MANUFACTURING METHOD OF THIN FILM TRANSISTOR

This application claims priority to Korean Patent Application No. 10-2008-0033175, filed on Apr. 10, 2008, and all the benefits accruing therefrom under 35 U.S.C. §119, the contents of which in its entirety are herein incorporated by reference.

BACKGROUND OF THE INVENTION (a) Field of the Invention

The present invention relates to a mask for silicon crystallization, and a method for forming a polysilicon thin film using the same.

(b) Description of the Related Art

A silicon thin film that is deposited to form a thin film transistor ("TFT"), which may be used as a switching element in an active liquid crystal display or organic light emitting device, is formed by a plasma enhanced chemical vapor deposition ("PECVD") process. Advantages to PECVD processing are that the resulting silicon layer has substantial uniformity and the deposition may be rapidly accomplished. Elements having high electron mobility are required for products such as a system on glass ("SOG") in which an amorphous silicon layer is formed by PECVD and crystallized into polysilicon by a laser, and then a low temperature polycrystalline silicon ("LTPS") for manufacturing a thin film transistor using the polysilicon.

However, the amorphous silicon layer formed through the PECVD includes a large amount of hydrogen due to $SiH_4$ or $Si_2H_6$ used as a source gas and H2 as a carrier gas in the deposition process, and the large amount of hydrogen temporarily absorbs the laser having high energy under the laser crystallization such that it is vaporized and explosively outgassed. Accordingly, the amorphous silicon is crystallized and simultaneously many voids are produced, such that a dehydrogenation process is inevitably required through heat treatment before crystallization to avoid the explosive outgassing. Therefore, an additional apparatus is required and the process time is increased, such that they are many difficulties in the producing process of LTPS.

BRIEF SUMMARY OF THE INVENTION

The present invention provides a mask for silicon crystallization and a method for forming a polysilicon thin film for simultaneously realizing dehydrogenation and crystallization.

An exemplary embodiment of a silicon crystallization mask according to the present invention includes; a main exposure portion including a plurality of complete light transmission regions which completely transmit light therethrough, and a preliminary exposure portion including a plurality of incomplete light transmission regions, which each partially transmit light therethrough, wherein at least two of the plurality of incomplete light transmission regions have different magnitudes of light transmittance from each other.

In one exemplary embodiment, the preliminary exposure portion may be disposed on one side of the main exposure portion, and the plurality of incomplete light transmission regions may have decreasing light transmittance away from the main exposure portion.

In one exemplary embodiment, the plurality of incomplete light transmission regions may each include a plurality of transmission openings, and the difference between the magnitudes of the light transmittances of the incomplete light transmission regions may be obtained by changing the interval between the plurality of transmission openings. In one exemplary embodiment, a difference of light energy density between two neighboring incomplete light transmission regions may be in the range of about 20 $mJ/cm^2$ to about 60 $mJ/cm^2$.

In one exemplary embodiment, the main exposure portion may include a first light transmission region column where the complete light transmission regions are disposed in a first direction, and a second light transmission region column disposed substantially parallel to the first light transmission region column.

In one exemplary embodiment, a width of the incomplete light transmission regions may be equal to or greater than a length of the complete light transmission regions in a direction substantially perpendicular to the first direction.

In one exemplary embodiment, the plurality of incomplete light transmission regions may include incomplete light transmission layers having different light transmittances, and the light transmittances of the incomplete light transmission layer may be determined according to thicknesses thereof. In one exemplary embodiment, the difference of the light energy density between two neighboring incomplete light transmission regions may be in the range of about 20 $mJ/cm^2$ to about 60 $mJ/cm^2$.

In one exemplary embodiment, the incomplete light transmission layer may include at least one selected from the group consisting of Cr, MoSi, $Al_2O_3$, ZrO, $SiO_2$, and MgO.

In one exemplary embodiment, a method for forming a polysilicon thin film may include; depositing an amorphous silicon layer on a substrate, irradiating a first region of the amorphous silicon layer with a first intensity through a first portion of a silicon crystallization mask, irradiating the first region of the amorphous silicon layer with a second intensity that is higher than the first intensity through a second portion of the silicon crystallization mask, and irradiating the first region of the amorphous silicon layer with an intensity sufficient to melt the amorphous silicon layer through a third portion of the silicon crystallization mask.

In one exemplary embodiment, the method may further include; irradiating a second region of the amorphous silicon layer disposed adjacent to the first region with the first intensity at substantially the same time as the first region of the amorphous silicon layer is irradiated with the second intensity, the second region of the amorphous silicon layer may be irradiated with the second intensity, and a third region disposed substantially adjacent to the second region may be irradiated with the first intensity at substantially the same time as the first region of the amorphous silicon layer is irradiated with the first intensity.

In one exemplary embodiment, the method may further include; irradiating the first amorphous silicon layer with a third intensity that is higher than the second intensity between the irradiation of the first amorphous silicon layer with the second intensity and the irradiation of the first amorphous silicon layer with the intensity sufficient to melt the amorphous silicon layer, and the first intensity to the third intensity are in an energy density range of about 100 $mJ/cm^2$ to about 250 $mJ/cm^2$.

In one exemplary embodiment, the irradiation the first region of the amorphous silicon layer with an intensity sufficient to melt the amorphous silicon layer includes irradiation a portion of the first region with the intensity that is sufficient to melt the amorphous silicon layer through a first main exposure region of the third portion of the silicon crystallization mask, and irradiating a remaining portion of the first region with the intensity for melting the amorphous silicon layer through a second main exposure region of the third portion of the silicon crystallization mask.

An exemplary embodiment of a method for manufacturing a thin film transistor includes forming a polysilicon thin film by using the above-described exemplary embodiment of a method, patterning the polysilicon thin film to form a semiconductor layer, covering the semiconductor layer with a gate insulating layer, disposing a gate electrode on the gate insulating layer corresponding to the semiconductor layer, injecting impurities to the semiconductor layer to form source and drain regions in the semiconductor on respective sides of the gate electrode, and electrically connecting source and drain electrodes electrically connected to the source and drain regions.

According to an exemplary embodiment of the present invention, before irradiating the laser with the energy for crystallizing by melting the deposited amorphous silicon, lasers irradiate the amorphous silicon through several steps having gradually increased energy such that the dehydrogenation process may be stably and completely executed.

DETAILED DESCRIPTION OF THE INVENTION

Figure 1:
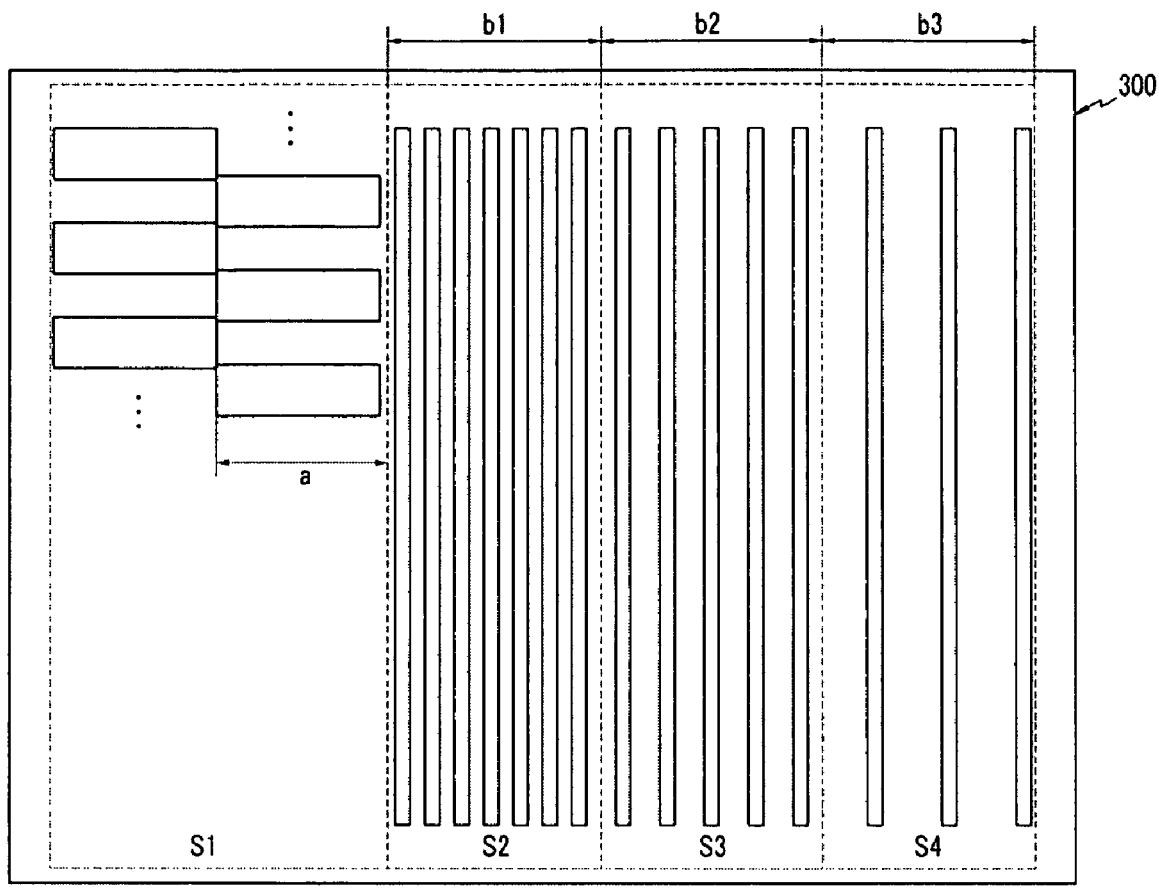
FIG. 1 is a top plan layout view of an exemplary embodiment of a mask for silicon crystallization according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures is turned over, elements described as being on the "lower" side of other elements would then be oriented on the "upper" side of the other elements. The exemplary term "lower" can therefore encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can therefore encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross-sectional illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Exemplary Embodiment 1

Now, an exemplary embodiment of a liquid crystal display ("LCD") according to the present invention will be described in detail with reference to FIG. 1.

FIG. 1 is a top plan layout view of an exemplary embodiment of a mask for silicon crystallization according to the present invention.

Referring to FIG. 1, an exemplary embodiment of a mask 300 for silicon crystallization according to the present invention includes a main exposure portion S1 and a plurality of preliminary exposure portions S2, S3, and S4. Although three preliminary exposure portions are shown, the number of preliminary exposure portions is not particularly limited.

The main exposure portion S1 includes a plurality of complete light transmission regions with a rectangular shape that are arranged in at least two columns, and the complete light transmission regions in the same columns are arranged at constant intervals from one another. Alternative exemplary embodiments of the complete light transmission regions may have a triangle shape or a rounded shape at the edges of both sides thereof. The width of the complete light transmission regions in the longitudinal direction is wider than the width of opaque regions in the longitudinal direction. The complete light transmission regions included in the light transmission region of the second column are disposed corresponding to opaque regions between the complete light transmission regions included in the light transmission region of the first column. Also, if the complete light transmission regions included in the light transmission region of the first column are extended, the complete light transmission regions included in the light transmission region of the first column may overlap the portions of the complete light transmission regions included in the light transmission region of the second column.

Accordingly, if exposure occurs through the complete light transmission region of the first column and exposure occurs through the second light transmission region of the second column after moving the mask 300 for silicon crystallization, the exposure for all portions is completed and the boundary region between the portion exposed by the light transmission region of the first column and the portion exposed by the light transmission region of the second column is repeatedly exposed. This is to induce grain growth that extends in upper and lower directions without a non-crystallization region in a sequential lateral solidification ("SLS") process.

The preliminary exposure portions S2, S3, and S4 include a plurality of openings elongated in a column direction, and the intervals between the openings are increased according to the preliminary exposure portions S2, S3, and S4 with increasing distance from the main exposure portion S1. That is, the intervals between the openings in preliminary exposure portion S2 are narrowest, the intervals between the openings in preliminary exposure portion S3 are wider than those in preliminary exposure portion S2, and the intervals between the openings in S4 are wider than both those in preliminary exposure portions S2 and S3. The width of the openings of the preliminary exposure portion S2, S3, and S4 may be changed according to the wavelength of the laser used for the crystallization process, and in one exemplary embodiment the width is substantially equal to the size of diffraction of the laser. When an excimer laser having wavelength about 308 nm is used for the crystallization process, the width of each of the openings of the preliminary exposure portion S2, S3, and S4 may be substantially equal to or less than about 1.5 μm. The width of each of the openings of the preliminary exposure portion S2, S3, and S4 may be preferably equal to or less than about 0.75 μm. When a solid state laser such as a YAG laser having wavelength about 532 nm is used for the crystallization process, the width of each of the openings of the preliminary exposure portion S2, S3, and S4 may be substantially equal to or more than about 1.0 μm and equal to or less than about 3.0 μm.

In the preliminary exposure portions S2, S3, and S4, the laser is not completely transmitted, but is only incompletely transmitted. The intensity of the transmitted laser becomes lower according to an increase in the width of the interval between openings. Accordingly, in the present exemplary embodiment, the intensity of the laser transmitting in S4 is lowest, the intensity of the laser transmitting in S3 is intermediate, and the intensity of the laser transmitting in S2 is highest. However, the intensity of the laser transmitting in S2 is lower than the intensity of the laser transmitting in the complete light transmission regions of the main exposure portion S1.

The intensity of the laser irradiated onto an amorphous silicon layer on a substrate is proportional to the energy density of the laser transmitted through the mask 300. The difference between the average energy density of the laser transmitting in S2 and the average energy density of the laser transmitting in S3, and the difference between the average energy density of the laser transmitting in S3 and the average energy density of the laser transmitting in S4 may be from about 20 mJ/cm$^2$ to about 60 mJ/cm$^2$. Here, 20 mJ/cm$^2$ is the lowest value obtained when considering the arrangement efficiency of the complete light transmission region of the mask, and if the difference of the energy density is more than 60 mJ/cm$^2$, the dissociation of the hydrogen in an underlying amorphous silicon layer may be rapidly generated such that the amorphous silicon thin film may be damaged, thereby determining 60 mJ/cm$^2$ to be the highest value. The widths b1, b2, and b3 of the preliminary exposure portions S2, S3, and S4 may be equal to or greater than the width a of the light transmission region of the main exposure portion S1. In an alternative exemplary embodiment, the openings of the preliminary exposure portions may be arranged in a lattice type configuration as well as the bar type configuration shown in FIG. 1.

Next, the process for crystallizing an amorphous silicone layer using the silicon crystallization mask will be described. FIG. 2 to FIG. 5 are cross-sectional views respectively showing the steps of an exemplary embodiment of a crystallization process using a mask for the silicon crystallization of amorphous silicon according to the present invention.

Figure 2:
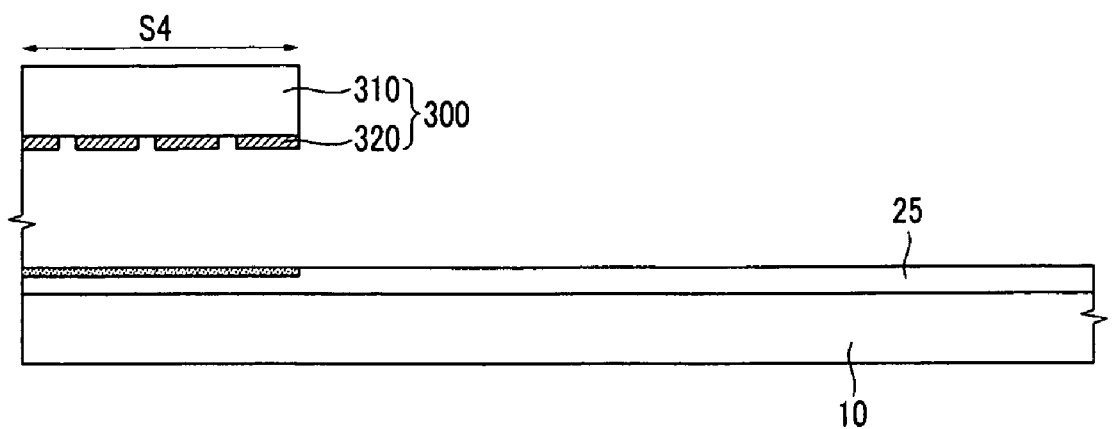
FIGS. 2 to 5 are cross-sectional views respectively showing the steps of an exemplary embodiment of a crystallization process using an exemplary embodiment of a mask for silicon crystallization of amorphous silicon according to the present invention.

Firstly, as shown in FIG. 2, an amorphous silicon layer 25 is deposited on a substrate 10, in one exemplary embodiment the deposition of the amorphous silicon layer 25 is conducted by PECVD, and the preliminary exposure portion S4 having the widest interval between the openings of the silicon crystallization mask 300 is aligned on a first region of the amorphous silicon layer 25, and a laser is irradiated therethrough. In the present exemplary embodiment, the silicon crystallization mask 300 includes a transparent substrate 310, and an opaque layer 320 including openings and complete light transmission regions. Exemplary embodiments include configurations wherein the opaque layer 320 may include at least one selected from the group of Cr, MoSi, Al$_2$O$_3$, ZrO, SiO$_2$, and MgO. In the present exemplary embodiment, the cross-section of the laser beam may correspond to the entire surface of the mask 300. The intensity of the laser become low when the laser transmits through the preliminary exposure portion S4 such that the amorphous silicon layer 25 is not substantially melted, and as a result the hydrogen gas included in the amorphous silicon layer 25 is outgassed and a partial dehydrogenation process is executed.

Figure 3:
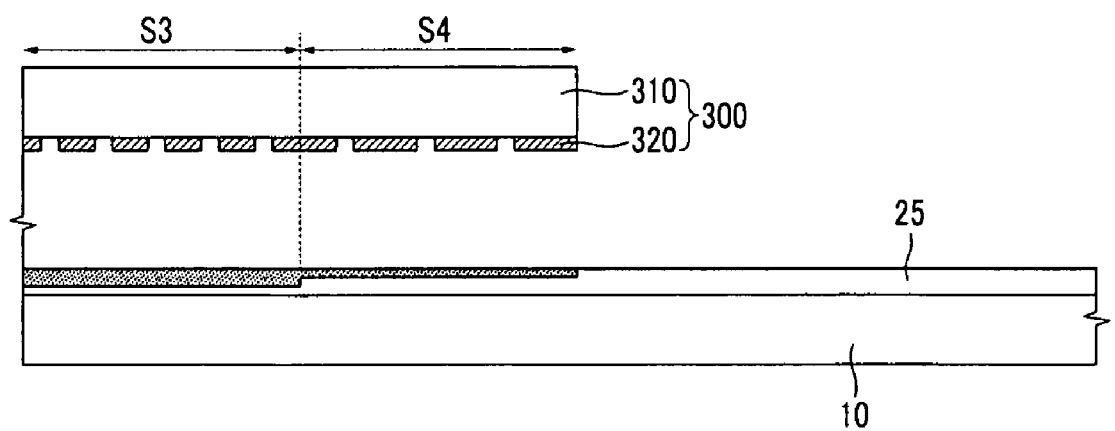

Next, as shown in FIG. 3, the silicon crystallization mask 300 is moved to align the preliminary exposure portion S4 having the widest interval between the openings on a second region adjacent to the first region. Here, the preliminary exposure portion S3 having the next wider interval between openings than the interval of S4 is aligned on the first region. Next, the laser may be irradiated and the dehydrogenation process may be simultaneously executed at the second region and the first region. Here, the intensity of the laser transmitted through the preliminary exposure portion S3 is higher than that of the laser transmitted through the preliminary exposure portion S4 such that the first region is additionally dehydrogenated to a deeper depth.

Figure 4:
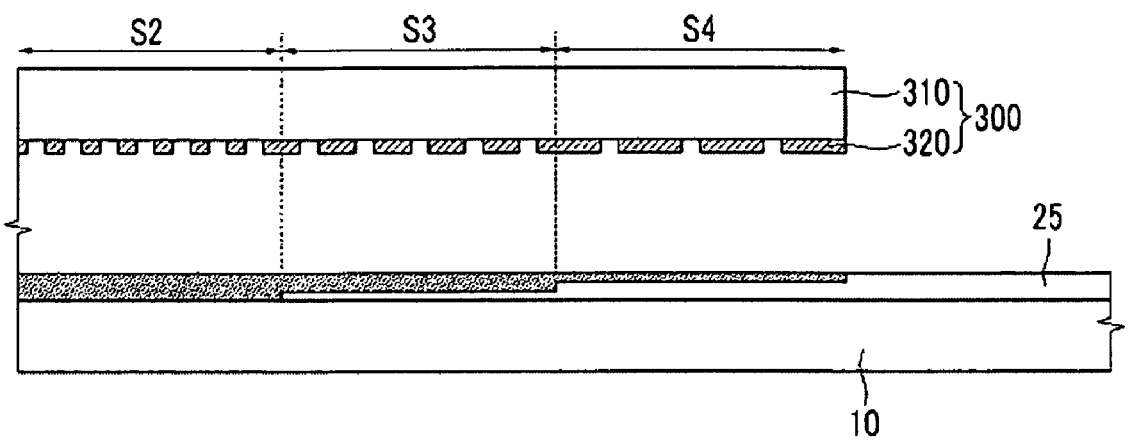

As shown in FIG. 4, the silicon crystallization mask 300 then moves to align the preliminary exposure portion S4 having the widest interval between openings to a third region adjacent to the second region. Here, the preliminary exposure portion S3 is disposed on the second region, and the preliminary exposure portion S2 is disposed on the first region. The laser may then be irradiated and the dehydrogenation process may be simultaneously executed from the first region to the third region. The intensity of the laser transmitted through the preliminary exposure portion S2 is higher than that of the laser transmitted through the preliminary exposure portion S3 such that the dehydrogenation process is executed to a deeper portion of the amorphous silicon layer 25 in the first region, thereby completing the dehydrogenation process.

Figure 5:
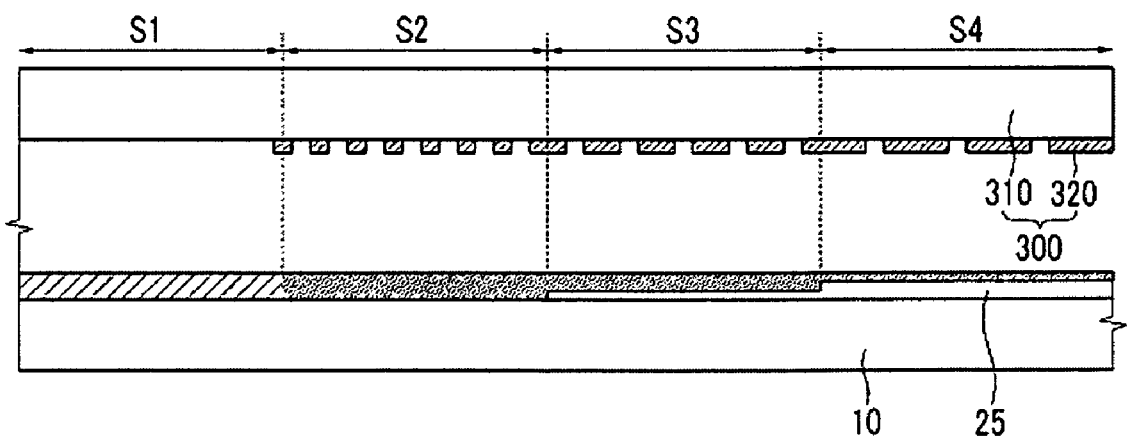

Next, as shown in FIG. 5, the silicon crystallization mask 300 moves to align the preliminary exposure portion S4 having the widest interval between openings to a fourth region adjacent to the third region. Here, the preliminary exposure portion S3 is disposed on the third region, the preliminary exposure portion S2 is disposed on the second region, and the light transmission region of the first column of the main exposure portion S1 is disposed on the first region. Next, the laser may be irradiated and the dehydrogenation process may be executed from the second region to the fourth region, and the portion of the amorphous silicon layer 25 corresponding to the complete light transmission region of the main exposure portion S1 may be melted in the first region.

Polycrystallization is then executed by crystallizing the melted amorphous silicon layer 25. The crystallization starts from the boundary between the melted portion and the non-melted portion of the amorphous silicon layer 25 such that the polycrystalline grain has a long shape in a longitudinal direction. Here, the dehydrogenation process may be completely executed through the preliminary exposure portions S2, S3, and S4 under the irradiation of the laser such that the hydrogen is not outgassed in the polycrystallization process. Accordingly, an excellent polysilicon layer without voids may be formed.

Here, in an exemplary embodiment wherein the amorphous silicon has a thickness of about 500 angstroms, the dehydrogenation is generated at about 150 mJ/cm$^2$ to about 200 mJ/cm$^2$ such that it may be determined that the energy density of the laser irradiated through the preliminary exposure portions S2, S3, and S4 for only dehydrogenation is in the range of about 100 mJ/cm$^2$ to about 250 mJ/cm$^2$. Also, the difference between the average energy density of the laser transmitting in S2 and the average energy density of the laser transmitting in S3, and the difference between the average energy density of the laser transmitting in S3 and the average energy density of the laser transmitting in S4 may be from about 20 mJ/cm$^2$ to about 60 mJ/cm$^2$. Here, 20 mJ/cm$^2$ is the lowest value obtained when considering the arrangement efficiency of the complete light transmission region of the mask, and if the difference of the energy density is more than about 60 mJ/cm$^2$, dissociation of the hydrogen may be rapidly generated such that the amorphous silicon thin film may be damaged, thereby determining 60 mJ/cm$^2$ to be the highest value.

Next, the silicon crystallization mask 300 is moved to align the light transmission region of the second column of the main exposure portion S1 on the first region, and then the laser may be irradiated and the portions that correspond to regions between the complete light transmission regions in the step of the previous laser irradiation, which were not previously irradiated by the laser, are irradiated such that all portions of the first region are polycrystallized.

Likewise, by repeatedly performing these processes, the whole amorphous silicon layer 25 may be dehydrogenated and polycrystallized.

According to an exemplary embodiment of the present invention, the dehydrogenation process is executed through several preliminary exposure steps of irradiating the laser having gradually increasing energy, thereby completing dehydrogenation. Also, even if the intensity of the laser is changed according to the thickness of the amorphous silicon layer, the intensity of the laser may be controlled into the several steps such that the explosive outgassing of the hydrogen may be prevented. Accordingly, the dehydrogenation may be stably executed.

In one exemplary embodiment, the polysilicon thin film that is crystallized by the above-described method may be used for a thin film transistor ("TFT"). This will be described with reference to FIG. 6 to FIG. 8.

Figure 6:
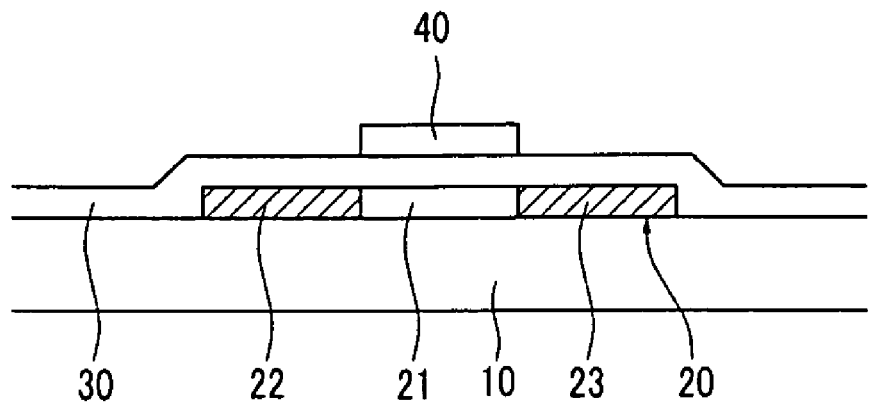
FIGS. 6 to 8 are cross-sectional views showing an exemplary embodiment of a method for manufacturing a thin film transistor array panel using a polysilicon layer formed through the exemplary embodiment of a crystallization process according to the present invention.

Firstly, as shown in FIG. 6, a polysilicon layer formed through the dehydrogenation and the crystallization is patterned by photolithography using an active mask to form a semiconductor layer 20, and silicon oxide ("SiO$_2$") or silicon nitride ("SiNx") is deposited to form a gate insulating layer 30. Next, a conductive material for a gate wiring is deposited and patterned to form a gate electrode 40 on a channel region 21 of the semiconductor layer 20. Next, n-type or p-type impurities are ion-injected to the semiconductor layer 20 by using the gate electrode 40 as a doping mask, and the semiconductor layer 20 is activated to form source and drain regions 22 and 23 on respective sides of the channel region 21.

Figure 7:
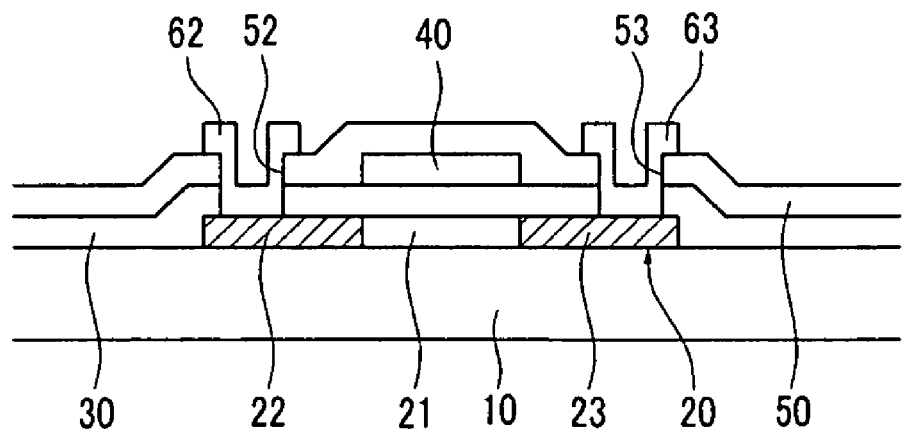

As shown in FIG. 7, an interlayer insulating layer 50 covering the gate electrode 40 is formed on the gate insulating layer 30, and the gate insulating layer 30 and the interlayer insulating layer 50 are patterned to form contact holes 52 and 53 exposing the source and drain regions 22 and 23 of the semiconductor layer 20. Next, a metal layer for a data wiring is deposited and patterned to form source and drain electrodes 62 and 63 respectively connected to the source and drain regions 22 and 23 through the contact holes 52 and 53.

Figure 8:
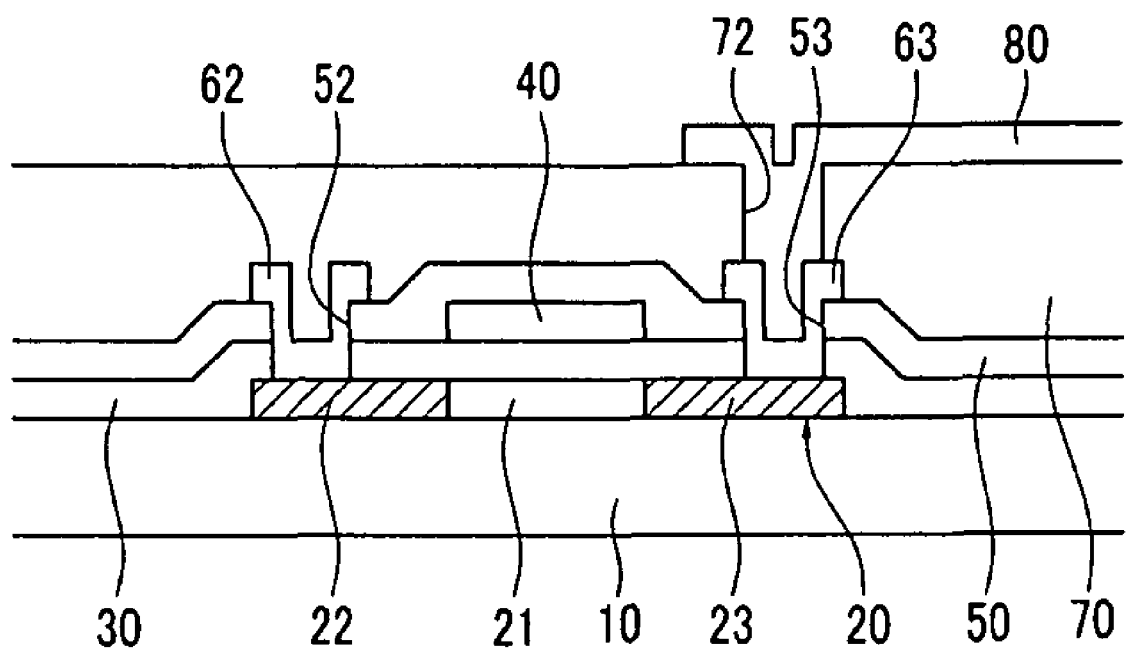

Then, as shown in FIG. 8, a passivation layer 70 made of an insulating material is formed and patterned to form a contact hole 72 exposing the drain electrode 63. Next, a transparent conductive material, exemplary embodiments of which include indium tin oxide ("ITO") or indium zinc oxide ("IZO"), or a conductive material having reflectance is deposited on the passivation layer 70 and patterned to form a pixel electrode 80.

Exemplary Embodiment 2

Figure 9A:
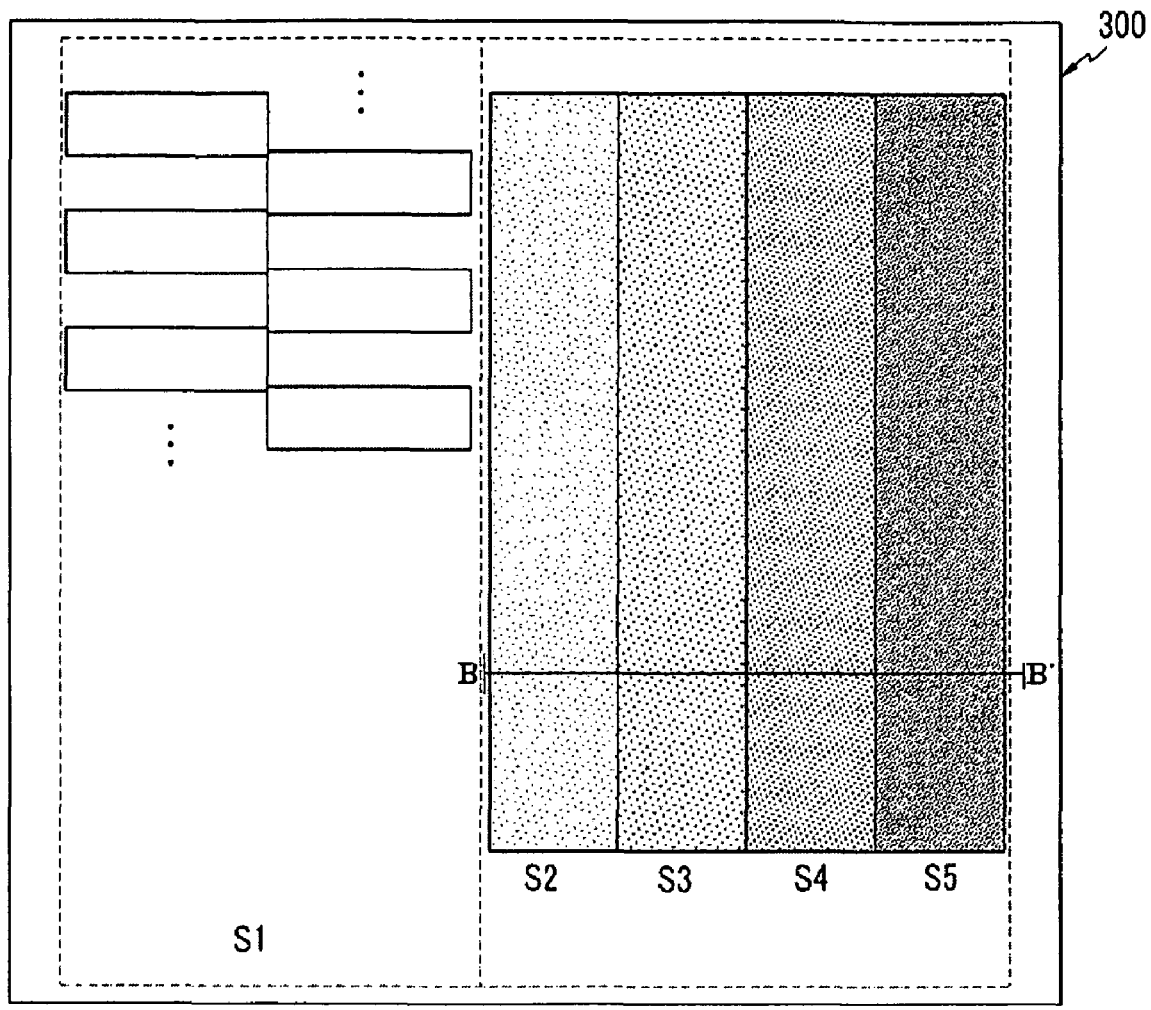
FIG. 9A is a top plan layout view of another exemplary embodiment of a mask for silicon crystallization according to the present invention.
Figure 9B:
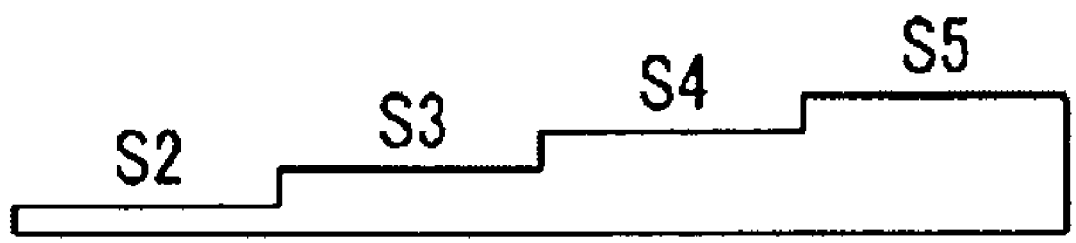
FIG. 9B is a cross sectional view of the exemplary embodiment of a silicon crystallization mask according to the present invention taken along line B-B' of FIG. 9A.

FIG. 9A is a top plan layout view of another exemplary embodiment of a silicon crystallization mask according to the present invention. FIG. 9B is a cross sectional view of the exemplary embodiment of a silicon crystallization mask according to the present invention taken along line B-B' of FIG. 9A.

A silicon crystallization mask 300 of FIG. 9 includes a plurality of preliminary exposure portions S2, S3, S4, and S5 having incomplete light transmission layers with different thickness to control laser light transmittance therethrough, differently from the silicon crystallization mask of FIG. 1. That is, in the present exemplary embodiment, the incomplete light transmission layers respectively forming the preliminary exposure portions S2, S3, S4, and S5 have increasing thicknesses away from the main exposure portion S1 to weaken the intensity of the transmitted laser. Each of the incomplete light transmission layers S2, S3, S4 and S5 allow only a portion of the laser light incident thereon to pass therethrough, and the degree of light transmission is a function of the thickness of the incomplete light transmission layer, wherein thicker layers allow less light to pass therethrough. Exemplary embodiments include configurations wherein the number of preliminary exposure portions may be two or more, in the exemplary embodiment shown in FIGS. 9A and 9B, there are four preliminary exposure portions S2, S3, S4, and S5. In one exemplary embodiment, the light transmission layers may include at least one of Cr, MoSi, $Al_2O_3$, ZrO, $SiO_2$, and MgO.

The description of the main exposure portion S1, and the method for polycrystallizing an amorphous silicon layer using the silicon crystallization mask 300, etc., are substantially the same as those of Exemplary Embodiment 1, and therefore duplicate explanation will be omitted.

The present invention may be applicable to a manufacturing process of the polysilicon thin film transistor used in the active display device such as an organic light emitting device, as well as to liquid crystal display, as a switching element.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A silicon crystallization mask comprising:
   a main exposure portion including a plurality of complete light transmission regions which completely transmit light therethrough; and
   a preliminary exposure portion including a plurality of incomplete light transmission regions, which each partially transmit light therethrough, wherein at least two of the plurality of incomplete light transmission regions have different magnitudes of light transmittance from each other, and wherein the preliminary exposure portion is disposed on one side of the main exposure portion, and the plurality of incomplete light transmission regions have light transmittance which decreases away from the main exposure portion.

2. The silicon crystallization mask of claim 1, wherein the plurality of incomplete light transmission regions each include a plurality of transmission openings.

3. The silicon crystallization mask of claim 2, wherein a width of each transmission opening is substantially equal to the size of diffraction of a laser which is a light used for exposure.

4. The silicon crystallization mask of claim 3, wherein the laser is a excimer laser and the width of each transmission opening is equal to or less than about 1.5 μm.

5. The silicon crystallization mask of claim 4, wherein the width of each transmission opening is equal to or less than about 0.75 μm.

6. The silicon crystallization mask of claim 3, wherein the laser is a solid state laser and the width of each transmission opening is equal to or more than about 1.0 μm and equal to or less than about 3.0 μm.

7. The silicon crystallization mask of claim 3, wherein the difference between the magnitude of the light transmittances of the incomplete light transmission regions is obtained by changing intervals between the plurality of transmission openings.

8. The silicon crystallization mask of claim 7, wherein a difference in light energy density between two neighboring incomplete light transmission regions is in the range of about 20 mJ/cm2 to about 60 mJ/cm2.

9. The silicon crystallization mask of claim 8, wherein the main exposure portion includes a first light transmission region column where the complete light transmission regions are disposed in a first direction and a second light transmission region column disposed substantially parallel to the first light transmission region column.

10. The silicon crystallization mask of claim 9, wherein a width of the incomplete light transmission regions is equal to or greater than a length of the complete light transmission regions in a direction substantially perpendicular to the first direction.

11. The silicon crystallization mask of claim 1, wherein the plurality of incomplete light transmission regions include incomplete light transmission layers having different light transmittances.

12. The silicon crystallization mask of claim 11, wherein the light transmittance of the incomplete light transmission layer is determined according the thickness thereof.

13. The silicon crystallization mask of claim 12, wherein the difference of the light energy density between two neighboring incomplete light transmission regions is in the range of about 20 mJ/cm2 to about 60 mJ/cm2.

14. The silicon crystallization mask of claim 13, wherein the incomplete light transmission layer includes at least one selected from the group consisting of Cr, MoSi, Al2O3, ZrO, SiO2 and MgO.

15. The silicon crystallization mask of claim 14, wherein the main exposure portion includes a first light transmission region column where the plurality of complete light transmission regions are disposed in a first direction, and a second light transmission region column disposed substantially parallel to the first light transmission region column.

16. The silicon crystallization mask of claim 15, wherein, a width of the incomplete light transmission regions is equal to or greater than a length of the complete light transmission regions in a direction substantially perpendicular to the first direction.

* * * * *